US006968524B2

(12) United States Patent
Jiang et al.

(10) Patent No.: US 6,968,524 B2
(45) Date of Patent: Nov. 22, 2005

(54) METHOD AND APPARATUS TO OPTIMIZE AN INTEGRATED CIRCUIT DESIGN USING TRANSISTOR FOLDING

(75) Inventors: Yanbin Jiang, Fremont, CA (US); Ilhami Torunoglu, San Jose, CA (US); Cyrus Bamji, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 7 days.

(21) Appl. No.: 10/240,436

(22) PCT Filed: Mar. 30, 2001

(86) PCT No.: PCT/US01/10557

§ 371 (c)(1),
(2), (4) Date: May 28, 2003

(87) PCT Pub. No.: WO01/75687

PCT Pub. Date: Oct. 11, 2001

(65) Prior Publication Data

US 2004/0010765 A1 Jan. 15, 2004

Related U.S. Application Data

(60) Provisional application No. 60/193,601, filed on Mar. 31, 2000.

(51) Int. Cl.[7] .............................................. G06F 17/50
(52) U.S. Cl. ................................. 716/10; 716/2; 716/8; 716/11
(58) Field of Search ............................. 716/2, 8, 10–11

(56) References Cited

U.S. PATENT DOCUMENTS 5,737,236 A * 4/1998 Maziasz et al. ................. 716/8
6,163,877 A 12/2000 Gupta

OTHER PUBLICATIONS

T.W.Her et al., "Cell Area Minimization by Transistor Folding", Pro. of European Design Automation Conference, 1993, pp 172–177).*
Chen, C.C. et al., "The Layout Snythesizer: An Automatic Netlist–to–Layout System", Proceedings of Design Automation Conference, 1989, pp. 232–238.
Chen, H.Y. et al., "iCoach, A Circuit Optimization Aid for CMOS High–Performance Circuits", Integration, the VLSI Journal, vol. 10, 1991, pp. 185–212.
Cirit, M.A., "Transistor Sizing in CMOS Circuits", Proceedings of Design Automation Conference, 1987, pp. 121–124.
Dia, Z. et al., "MOSIZ: A Two–Step Transistor Sizing Algorithm Based on Optimal Timing Assignment Method for Multi–Stage Complex Gates", Proceedings on Custom Integrated Circuits Conference, May 1989, pp. 17.3.1–17.3.4.
Fishburn, J.P. et al., TILOS: A Posynomial Programming Aproach to Transistor Sizing:, Proceedings of International Conference on Computer Aided Design, 1985, pp. 326–328.
Gupta, A. et al., "CLIP: An Optimizing Layout Generator for Two–Dimensional CMOS Cells", Proceedings of Design Automation Conference, 1997, pp. 452–455.

(Continued)

Primary Examiner—Donghee Kang
(74) Attorney, Agent, or Firm—Bingham McCutchen LLP

(57) ABSTRACT

A method and system are disclosed to optimize an integrated circuit layout design by determining possible lengths of layout rows that will reduce the total area of the integrated circuit layout (FIG. 4B). The possible row lengths (401B) are determined and stored in a memory unit as a set of possible optimal row length values. A set of possible optimal row heights corresponding to the determined set of possible rowlengths is determined and the total chip area is iteratively calculated. Optimal values of rowlength and row height are chosen based upon the maximum chip area reduction. Once the optimal row length and height parameters are chosen, transistor devices placed in each row of the integrated circuit layout are folded to achieve the optimal row length and height.

61 Claims, 5 Drawing Sheets

OTHER PUBLICATIONS

Gupta, A et al., "Optimal 2–D Cell Layout with Integrated Transistor Folding", Proceedings of International Conference on Computer Aided Design, 1998, pp. 128–135.

Hedlund, K.S., "AESOP: A Tool for Automated Transistor Sizing", Proceedings of Design Automation Conference, 1987, pp. 114–120.

Her, T.W. et al., "Cell Area Minimization by Transistor Folding", Proceedings of European Design Automation Conference, 1993, pp. 172–177.

Hill, D.D., Sc2: A Hybrid Automatic Layout System:, Proceedings of International Conference on Computer Aided Design, 1985, pp. 172–174.

Hill, D. et al., "Algorithms and Techniques for VLSI Layout Synthesis", Kluwer Academic Press, 1989, Boston.

Hsieh, Y–C., LIB: A Cell Layout Generator:, Proceedings of ACM/IEEE Design Automation Conference, 1990, pp. 474–479.

Hsieh, Y–C., "LiB: A CMOS Cell Compiler", IEEE Transation on CAD, vol. 10, Aug. 1991, pp. 994–1005.

Hwang, C–Y. et al., "An Efficient Layout Style for Two–Metal CMOS Leaf Cells and its Automatic Synthesis", IEEE Transactions on CAD, vol. 12, Mar. 1993, pp. 410–424.

Kim, J. et al., "An Efficient Transistor Folding Algorithm for Row–Based CMOS Layout Design", Proceedings of Design Automation Conference, 1997, pp. 456–459.

Ong, C.L. et al., GENAC: An Automatic Cell Synthesis Tool, Proceedings of Design Automation Conference, 1989, pp. 239–244.

Sapatnekar, S.S. et al., "An Exact Solution to the Transistor Sizing Problem for CMOS Circuits Using Convex Optimization", IEEE Transaction on Computer Aided Design, Nov. 1993, pp. 1621–1634.

Shyu, J. et al., "Optimization–Based Transistor Sizing", IEEE Journal on Solid State Circuits, Apr. 1988, pp. 400–409.

Tani, K. et al., "Two–Dimensional Layout Synthesis for Large–Scale CMOS Circuits", Proceedings of International Conference on Computer Aided Design, 1991, pp. 490–493.

* cited by examiner

METHOD AND APPARATUS TO OPTIMIZE AN INTEGRATED CIRCUIT DESIGN USING TRANSISTOR FOLDING

CROSS-REFERENCE TO RELATED APPLICATIONS

The present application claims priority from International Application No. PCT/US01/10557, filed on Mar. 30, 2001, which claims the benefit of U.S. Provisional Application Ser. No. 60/193,601, filed on Mar. 31, 2000, both of which are hereby incorporated by reference in their entireties for all purposes as if fully set forth herein.

1. TECHNICAL FIELD

The invention relates to a system and method of optimizing integrated circuits (ICs), and in particular to a system and method for providing an optimal IC layout designs using transistor folding.

2. BACKGROUND

As designers strive to improve the capabilities of new ICs, minimization of IC size continues to be an underlying goal. Typically, IC designs utilize previously developed circuit designs, from a library of circuit designs in new combinations and configurations to create wholly new designs capable of performing new functions or perhaps optimizing the performance of the previous IC designs. While some individual IC designs have been optimized in terms of performance and size, the combination of these circuits with other circuits into new custom designed ICs often utilize a re-configuration of transistor geometry to provide the optimal design of the overall new custom designed IC.

When custom designing a new high performance IC, individual transistors may be tuned to provide optimal speed. However, manually tuning individual transistor is both tedious and error-prone. While some automated transistor sizing tools exist to optimize individual transistors, the individual transistors still benefit from an optimal physical layout design to provide an optimal IC. Conventional layout designs place individual transistors on a layout using a row-based design style. In most cases, conventional row-based layout designs result in an inefficient utilization of chip area because the individual transistors are of non-uniform size and shape.

Transistor folding is a method of re-configuring the geometry of a known transistor design in order to minimize total chip area, while retaining the performance characteristics of the known design. In custom IC physical layout design, high performance requirements of new circuit designs nay necessitate the integration of various transistor devices of different sizes. In the typical row-based layout design style, non-uniform transistor heights in a row tend to waste overall IC chip area. Therefore, it is highly desirable to provide a system and method of transistor device folding which takes advantage of the different rows' lengths to achieve efficient area utilization of the entire IC layout.

3. SUMMARY

Accordingly, the present invention seeks to provide an IC design with an optimal chip area. An embodiment of the present invention is directed to a system and method of chip area optimization using row-based transistor folding techniques with a global impact analysis. By analyzing each transistor device placed in an IC layout, the embodiment may determine how best to re-configure the geometry of individual transistor, through the use of transistor folding, in order to optimize the size of the overall IC. The chip area that is optimized may consist of both the transistor area and the routing area. Another embodiment provides for sizing optimization in two dimensions. Moreover, another embodiment further analyzes the electrical impact transistor folding will have on each device placed within the IC layout. The embodiment utilizes this analysis to provide adequate routing area between rows to reduce parasitic electrical effects in its optimization process. Still further, another embodiment provides IC sizing optimization in a time that is linearly related to the overall number of transistors integrated within a single device. The transistor folding techniques of the various disclosed embodiments in conjunction with transistor sizing are designed to optimize the IC at the layout stage.

4. BRIEF DESCRIPTION OF THE DRAWINGS

5. DESCRIPTION OF THE PREFERRED EMBODIMENTS

Figure 1:
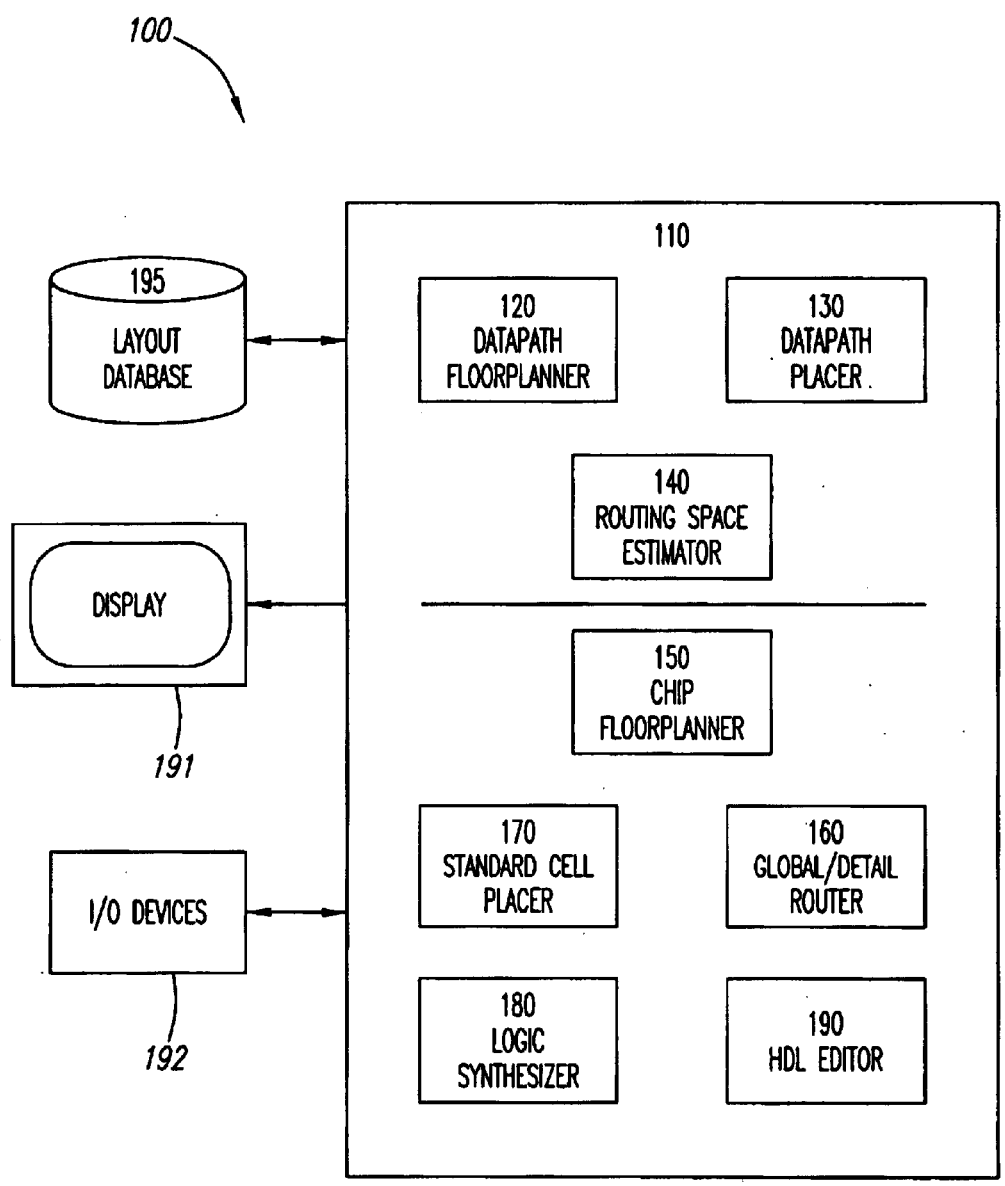
FIG. 1 is a diagram of a computer system that may be used in connection with various embodiments of the invention as described herein.

Preferred embodiments will now be described, with reference as necessary to the accompanying drawings.

Systems and methods are disclosed for physical layout of ICs in which transistors are folded in a manner to achieve efficient component layout by taking advantage of differences in the lengths of different rows in the circuit layout. To provide some useful context, this description will first discuss a preferred embodiment of a computer system and method for designing and creating integrated circuit chips.

By way of general background, chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

Two of the primary types of components used in integrated circuits are datapaths and control logic. Control logic, typically random logic, is used to control the operations of datapaths. Datapath areas of the circuit perform functional operations, such as mathematical or other operations.

The various components of an integrated circuit are initially defined by their functional operations and relevant inputs and outputs. The designer may also provide basic organizational information about the placement of components in the circuit using floorplanning tools. During these design states, the designer generally structures the circuit using considerable hierarchical information, and has typically provided substantial regularity in the design.

From the HDL or other high level description; the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity. In addition, the method and system described herein may be used with a full customized design, wherein the transistor cells are fully customized by the designer.

Further explanation of a particular chip design process, with emphasis on placement and routing of datapaths, is set forth, for example, in U.S. Pat. No. 5,838,583, hereby incorporated by reference as if set forth fully herein. Various embodiments as described herein relate in particular to the task of placing logic cells to arrive at a circuit layout.

FIG. 1 is a diagram of a computer system that may be used in connection with various embodiments of the invention as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Microsystems, Inc., or any other suitable computer.

The computer 110 contains stored program code including, in one embodiment, a datapath floorplanner 120, a datapath placer 130 and a routing space estimator 140. The datapath flooplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space used for routing the datapath functions, given the placement of such functions by the datapath placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™, Synergy™, and Verilog®, respectively.

The computer 110 is preferably coupled to a mass storage device (e.g., magnetic disk or cartridge storage) providing a layout database 195 with which the foregoing system components interface. The layout database 195 may be implemented using the EDIF database standard. The computer 110 may also comprise or be connected to mass storage containing one or more component libraries (not shown) specifying features of electrical components available for use in circuit designs.

Figure 2:
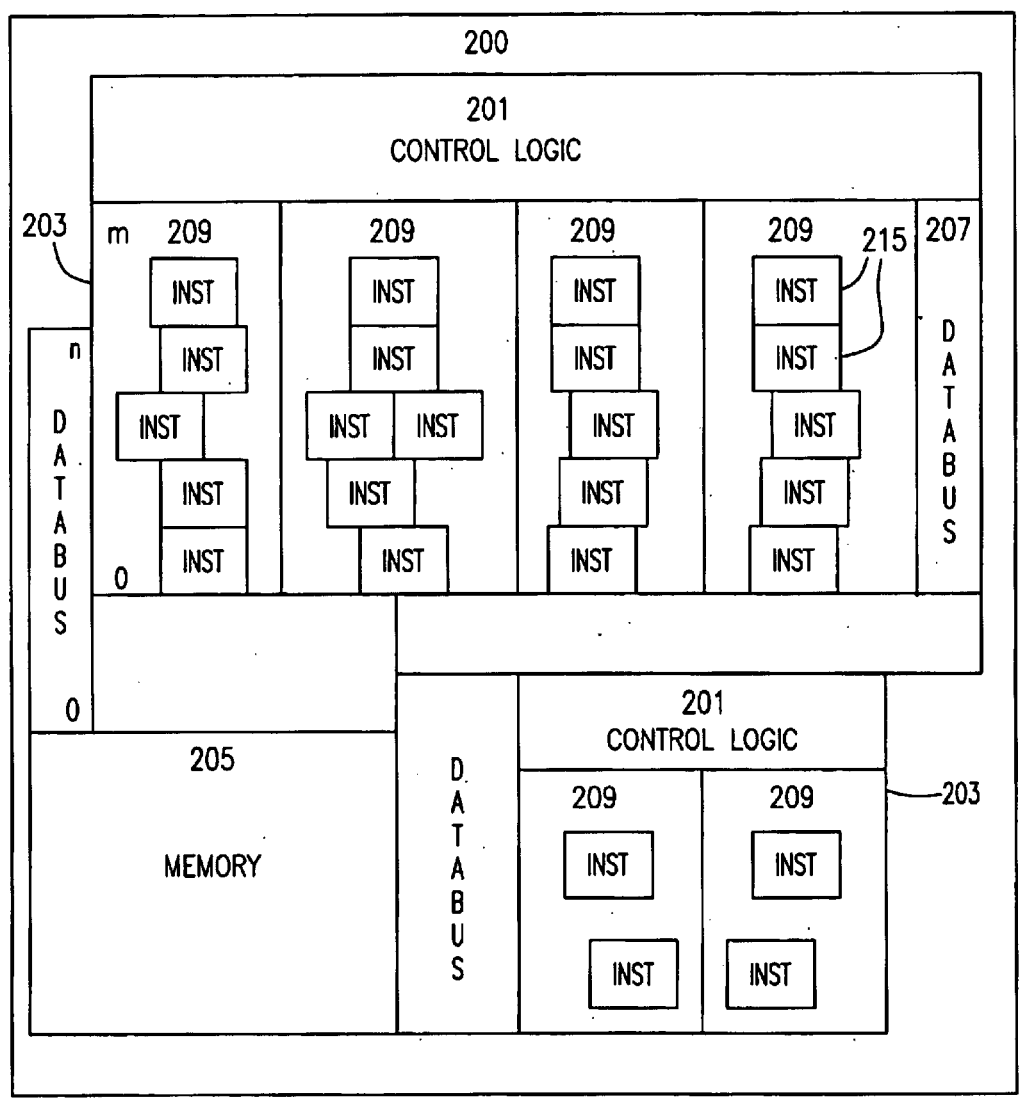
FIG. 2 is a diagram of a simplified integrated circuit as may be represented in the form of a virtual component block.

Referring now to FIG. 2, there is shown a schematic illustration of a simplified integrated circuit 200 that may be represented by virtual circuit design data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control regions 201, datapath regions 203, and memory 205. The various control regions 201, datapath regions 203 and memory 205 are interconnected with databuses 207 generally spanning multiple bits. Each datapath region 203 may comprise a plurality of datapath functions 209. A datapath function 209 may utilize some or all of the bits available from the databus 207. A datapath function 209 may comprise a plurality of cell instances 215 which enable some form of signal or logic transformation of the data passed by the databus 207. The cell instance 215 within a datapath function 209 generally operates on the data carried on the datapath function 209.

As represented in the schema of the layout database 195, the integrated circuit 200 is comprised of a plurality of instances and a plurality of nets. A net interconnects a number of instances, by associating pins on each of the instances.

Figure 3:
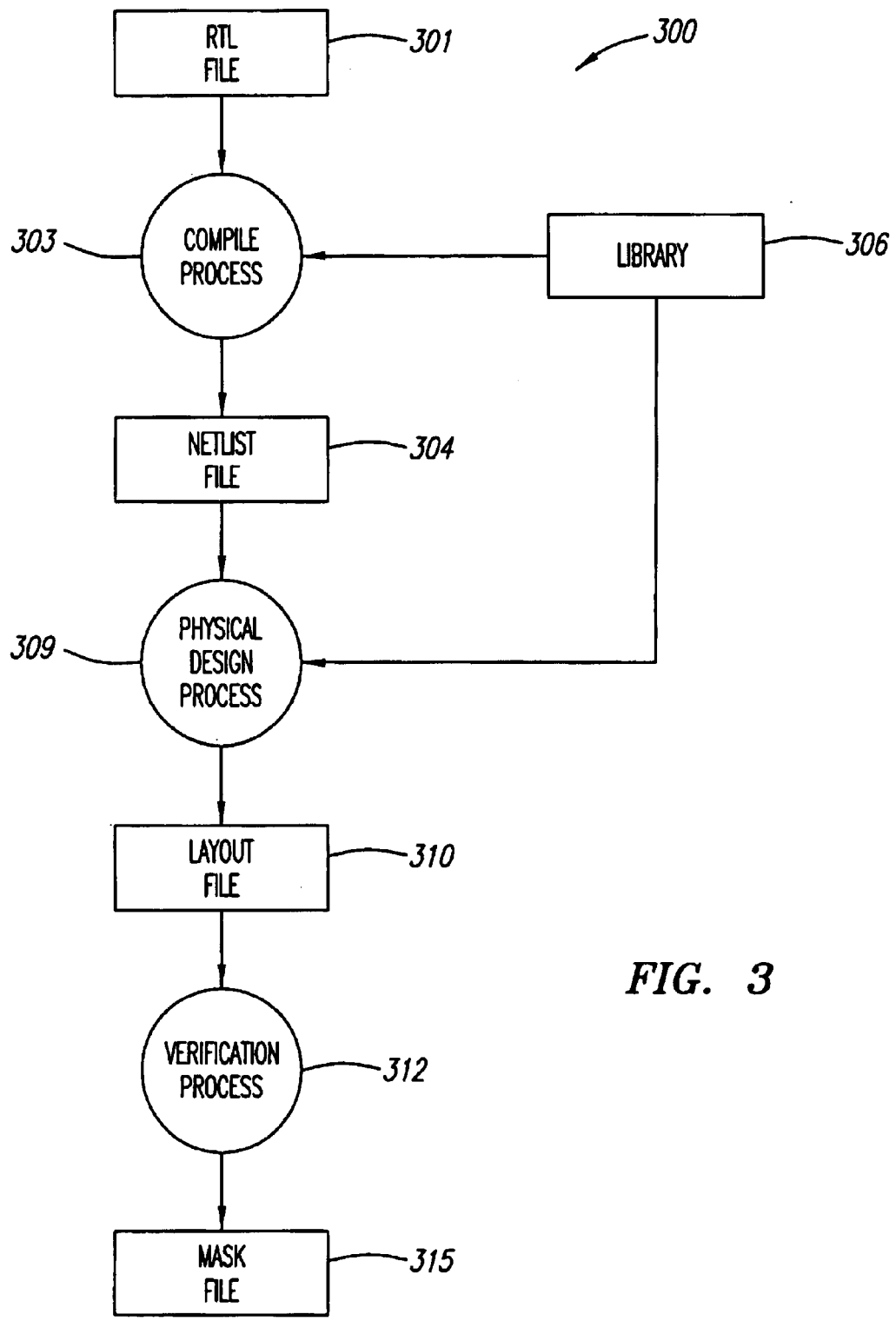
FIG. 3 is a diagram of a general process flow for a circuit design, illustrating various levels of circuit abstraction.

FIG. 3 is a diagram of a general process flow for a circuit design, illustrating some of the various levels of circuit abstraction as described above. As illustrated in FIG. 3, a register transfer logic (RTL) file 301 in the form of an HDL file or other high level functional description undergoes a compile process 303, which typically includes some form of logic synthesis, and converts the functional description of the circuit into a specific circuit implementation which may be stored in the form of a netlist file 304. As part of the compile process 303, a component library 306 is generally referenced, which stores information concerning what types of design components are available, and the characteristics of those design components which are needed in order to determine their functional connectivity. At this process stage, some attempt may be made at circuit optimization in order to minimize the number of components used in the circuit design. The netlist file 304, as previously noted, generally identifies the specific logic cell instances from a target standard cell library, and describes the specific cell-to-cell connectivity.

By application of a physical design process 309 shown in FIG. 3, the logic cells of the netlist file 304 are then placed and routed, resulting in a layout file 310. The component library 306 is utilized in this process stage in order to obtain information concerning the sizes of gates and other components that may be present in the netlist file 304.

From the layout file 310, a verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

According to the preferred embodiments as described herein, the physical design process 309 includes a process to efficiently layout a circuit design in part by transistor folding in a manner so as to take advantage of the different row lengths in the integrated circuit 200. Preferably, the netlist file 304 which identifies the specific logic cell instances from a target standard cell library (e.g., component library 316) or from the full custom designed transistor cells and which describes the specific cell-to-cell connectivity, is used as an input to the process. The resulting output from the process is a layout file 310 containing an efficient component layout for the integrated circuit 200, including folded transistors.

Transistor folding techniques described herein may be implemented as a computer program on the computer system 100 described previously for integrated circuit chip design. In addition, some or all of the methods steps performed in the present invention may be implemented as hardware (e.g., using a programmable logic device), or a combination of hardware and software. Additionally, some or all of the method steps may be implemented using a computer usable/readable medium that is usable by a processor to execute the inventive methods. The associated methods may be partially or completely automated. The resulting layout file 310 from the disclosed processes may be used to create an integrated circuit chip 200 with components arranged to achieve efficient spatial utilization.

In one embodiment as disclosed herein, for a circuit design having transistors laid out in rows, a method for area layout reduction includes the steps of determining the maximum row length, determining a set of possible row lengths for each row, selecting a row length for each row resulting in the most area reduction for that row, determining a minimum height after folding for each row, determining a set of possible new heights for each row, and selecting a new height for each row from the set of possible new heights, the new height being above the row's minimum height but below the row's current height, such that the area of the layout is reduced. Selection of the new height for each row may involve an iterative process wherein each possible new height is tested and the resulting savings in area calculated. Once the new height is selected, transistors in the given row are folded to accommodate the new height.

Figure 4A:
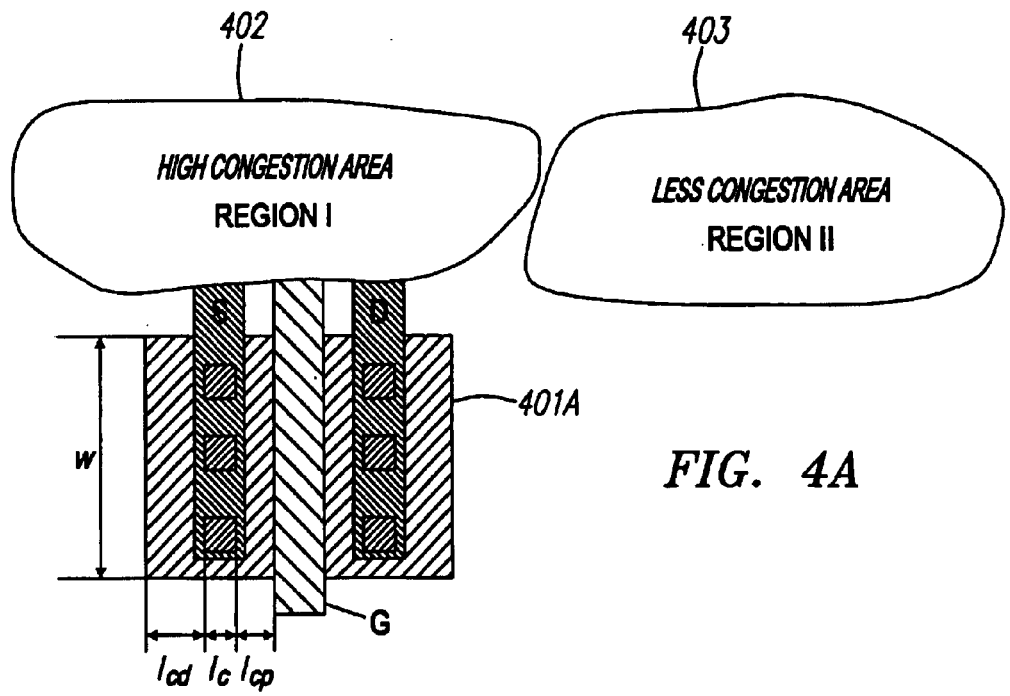
FIGS. 4a and 4b illustrate the principle of transistor folding.
Figure 4B:
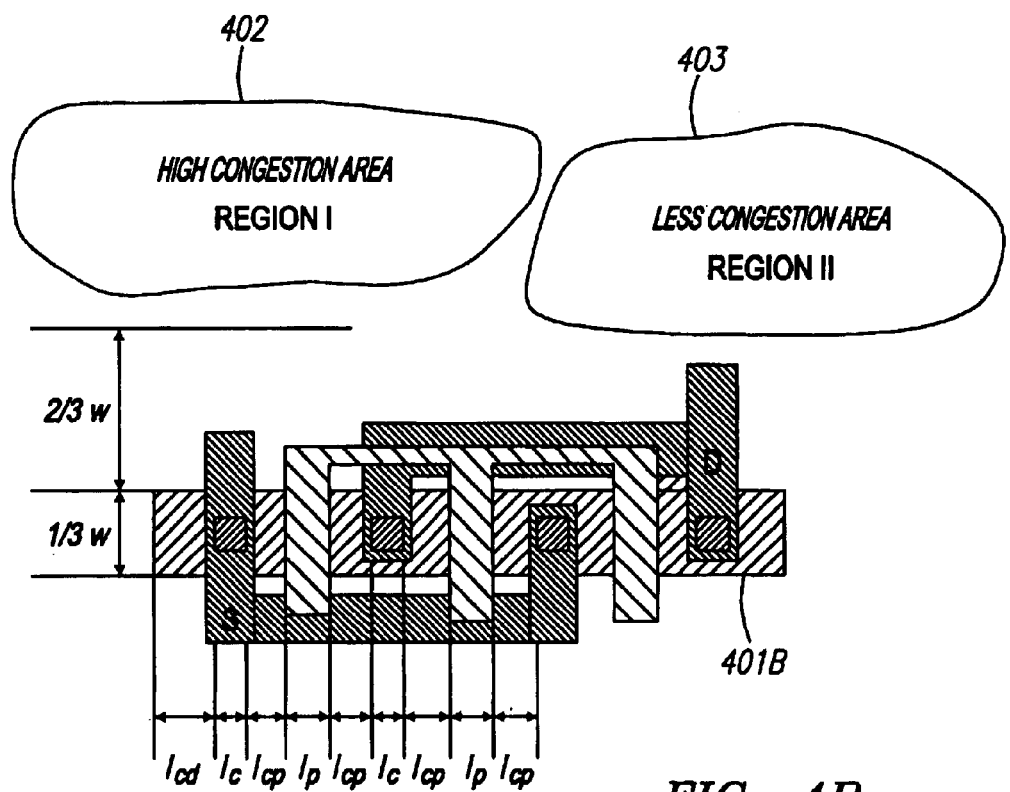

FIGS. 4a and 4b illustrate a basic physical design process 309 in which a transistor device 401a is folded to achieve a more efficient component layout. FIG. 4a depicts a transistor device 401a having a height W and comprising a source area S, gate area G, and drain area D. In FIG. 4a, transistor device 401a is shown to have a minimum space between the contact and diffusion $l_{cd}$, a length of the contact $l_c$, and a minimum space between the contact and poly-silicon area $l_{cp}$. As shown in FIG. 4a, the transistor device 401a has been placed under high congestion area 402. In the example depicted in FIG. 4a, transistor device 401a may represent the tallest transistor device placed in the row. Disposed above transistor 401a are regions of high congestion area 402 and low congestion area 403. Areas 402 and 403 may represent additional transistor elements or their respective routing layers which may cause electrical interference if placed too closely to transistor device 401a. Areas of high congestion (402) may contain a large number of transistors or routing elements whereas areas of low congestion may contain fewer to no elements, which cause electrical interference upon transistor 401a. FIG. 4a also depicts an area to the right of transistor device 401a, directly beneath low congestion area 403. As this area contains no transistor device cells, prevents efficient utilization of the IC chip area is not achieved.

As the distance between diffusion areas of the transistor device 401a and the high congestion area 402 decreases, the probability parasitic electrical effects affecting the performance of the transistor device 401a increases. In addition, it may be the case that as the distance between diffusion areas of the transistor device 401a and the high congestion area 402 decreases, completion of the IC design is not possible. This is because the routing between rows on a layout may not be placed in the limited space between diffusion area and congestion area. A minimum distance K must be reserved between rows to allow for routing between rows. By increasing the minimum distance between rows the probability of performance degradation of transistor device 401a decreases. Alternatively, a transistor device may be folded to decrease the height requirement and the entire total chip area of the IC is decreased. Thus, the reserved distance K between rows is maintained and the total chip area is decreased.

FIG. 4b illustrates the same transistor device 401b after it has undergone a re-configuration of its geometry. As shown in FIG. 4b, transistor device 401b retains the same $l_{cd}$, $l_c$, $l_{cp}$ dimensions so that no additional parasitic effects occur as a result of the folding technique. Additionally the electrical contacts and performance of transistor device 401b provide the same results as transistor 401a. However, as shown in FIG. 4b, the distance between the diffusion area of transistor device 401b to the high congestion area 402 increases by ⅔ W. Thus, the performance of the circuit may be dramatically improved and less likely to be subject to parasitic effects. As a result, both areas 402 and 403 may subsequently be lowered on the actual physical layout of the IC without degrading the performance of the IC. Thus, the total chip area of the IC may be more efficiently utilized.

Next, the impact transistor folding has on the transistor performance is discussed. Referring again to FIGS. 4a and 4b, the main concern with transistor folding is whether the performance of the transistor device after folding is better, worse than or the same as the performance before the folding. The main factors that affect the performance of the transistor in the layout view are the parasitic parameters, such AS (area of source), AD (area of drain), PS (periphery of source), and PD (periphery of drain). These parasitic parameters will affect the parasitic computation of the transistor and result in the different delays of the transistor. Because of the symmetry of the source and drain, the analysis of AD and PD are the same as AS and PS. Thus, only an analysis of AS and PS is performed. Before the folding, AS can be calculated as:

$$AS_{before} = W(l_{cd} + l_c + l_{cp}) \quad (1)$$

where W is the width of the transistor. The value of $l_{cd}$ is the minimum space between the contact and the diffusion. $l_c$ is the length of the contact and $l_{cp}$ is the minimum space between the contact and the poly region. After the folding, the source S has been split as two sources connected by a local wire, as shown in FIG. 4b. The new AS can be calculated as:

$$AS_{after} = \tfrac{1}{3} W(l_{cd} + l_c + l_{cp}) + \tfrac{1}{3} W(l_{cp} + l_c + l_{cp}) \quad (2)$$

Comparing $AS_{after}$ with $AS_{before}$:

$$AS_{before} - AS_{after} = \tfrac{1}{3} W(2 l_{cd} + l_c) \quad (3)$$

In an embodiment, the value of $AS_{before} - AS_{after}$ is always greater than 0, which means the parasitic AS is reduced after folding. The smaller AS improves the transistor performance in terms of speed.

Next, the PS analysis is performed. Before the folding $PS_{before}$ is:

$$PS_{before}=2(W+l_{cd}+i_c+l_{cp}) \quad (4)$$

After folding, $PS_{after}$ is:

$$PS_{after}=2(\tfrac{1}{3}W+l_{cd}+l_c+l_{cp}+\tfrac{1}{3}W+l_{cp}+l_c+l_{cp}) \quad (5)$$

Comparing $PS_{after}$ with $PS_{before}$:

$$PS_{before}-PS_{after}=2(\tfrac{1}{3}W+l_{cd}-l_{cp}) \quad (6)$$

The value of $PS_{before}-PS_{after}$ is greater than 0 in many cases. Therefore, in many cases, folding the transistor also reduces the parasitic parameter PS.

Transistor folding further improves the IC performance by benefiting the routing between the various transistor devices incorporated into the overall IC. When a transistor device is folded, two regions on the IC layout will be affected. In FIGS. 4a and 4b, areas 402 and 403 are shown as the two areas affected by transistor device folding. Areas 402 and 403 may contain either an area of high congestion or low congestion. While in FIGS. 4a and 4b, area 402 is depicted as high congestion area and area 403 is depicted as low congestion area, statistically there are four combinations of areas 402 and 403 that may occur. The benefits of transistor folding may affect the overall performance in a variety of ways depending upon the configuration of the surrounding transistor devices.

Case 1: Area 402 is a high congestion area for routing, area 403 is a less congested area. After folding, there will be approximately ⅔W extra space for the routing. The wires for connecting the source and drain can either use that space to connect the first source and drain terminals on the left side or use area 403 to connect the first source and drain terminals on the right side. Either way can reduce the burden of the high congestion area 402.

Case 2: Area 402 is a high congestion area, area 403 is also a high congestion area. After transistor folding, these congestion areas will be alleviated by using the extra space ⅔W provided to them for routing after the transistor folding.

Case 3: Area 402 is a less congested area, area 403 is also a less congested area. The transistor folding impact on the routing may not be significant, since ample area for routing is provided between the transistor device and areas 402 and 403 both before and after transistor folding.

Case 4: Area 402 is a less congested area, area 403 is a high congestion area. Since adequate space is available for routing wires before the transistor folding, the connecting wires for the source and drain can go from the area 402. Thus, in this case, the transistor folding impact on the routing may not be significant.

Overall, from the above four cases, it can be seen that transistor folding can benefit routing. In many cases, it alleviates overcrowding of certain areas upon the IC layout. Thus, transistor folding continues to improve the performance of each individual transistor device.

While it has been shown above that several electrical characteristics of the resulting folded transistor device are improved, the introduction of additional wires to connect the folded source and drain terminals may slightly degrade the performance of the transistor device 401b. Referring to FIGS. 4a and 4b, the resulting source and drain terminals of folded transistor 401b are separated from one another after the folding procedure and may require an additional length of wire to re-connect the terminals. The additional length of wire is introduced to the connecting wire for S is approximately $2l_c+4l_{cp}+2l_p$ (the distance between the two source terminals in folded transistor 401b). $l_p$ is the poly wire width. Before folding, the local wire length for the source terminals S is W. After folding, the local wire length for S is $$S=\tfrac{1}{3}W+2l_c+4l_{cp}+2l_p \quad (7)$$

Therefore, whether the wire becomes longer or shorter is determined by the difference between ⅔W and $2l_c+4l_{cp}+2l_p$. If ⅔W is greater than $2l_c+4l_{cp}+2l_p$, then the wire becomes shorter after the folding and the performance of the transistor will be better. Otherwise, the wire becomes longer and the performance of the translator may be deteriorated. Despite the potential for a slight degradation in IC performance due to an increased length of local wire connecting the various folded source and drain terminals, it can be seen that transistor folding not only re-configures the geometry of a transistor device, but may also help to improve transistor performance.

The preferred method described herein seeks to utilize transistor folding at the layout stage to achieve the minimum chip area for an entire IC. A chip area consists of both area occupied by the transistor devices and the area occupied by the necessary routing area.

Due to design constraints the area occupied by transistor devices within an IC will utilize a minimal required area. Thus, in one embodiment the calculation of transistor area is:

$$\text{Area}_{transistors}=\Sigma \text{rowheight}_i*\text{maxrowlength} \quad (8)$$

$$\text{rowheight}_i=\max W_{ji} \text{ subject to } W_{ji}\geq \text{MINSIZE} \quad (9)$$

where $\text{rowheight}_i$ is the height of the ith row. $W_{ji}$ is the width of the jth transistor in row i. Maxrowlength is the longest row's length of the layout. It includes the diffusion gap and space between the transistors in the same row for routing. MINSIZE is the minimum transistor size. For simplicity, MINSIZE is used instead of using PMINSIZE and NMINSIZE separately. PMINSIZE represents the minimum size of pfet transistors and NMINMIZE represents the minimum size of nfet transistors.

Optimization of the actual physical layout of the IC can additionally involve minimizing the area occupied by the routing. By reducing the routing area, the total chip area of the IC may be reduced. In the designing of the layout that will undergo transistor folding, a vertical space K is already reserved for the routing between rows. However, the folding procedures for the transistors change the shapes of the transistors and may further affect the routing. The estimation of the routing area changed due to the transistor fold is difficult if the transistor folding procedure is executed before the layout. However, in the various embodiments, the estimation is facilitated, because a vertical space K has already been reserved for the routing and any changes for the existing wire due to the transistor folding can be assumed as the local changes. Thus, in this embodiment the calculation of the routing area for each row is:

$$\text{Area}_{routing}=(K+S_{ji}(n))*\text{maxrowlength} \quad (10)$$

where K is defined above as the space reserved for the routing between rows. $S_{ji}(n)$ is the additional space introduced locally by the transistor j at row i with ii folds due to folding.

The following will describe the manner in which $S_{ji}(n)$ is calculated in an embodiment of the invention. In the example illustrated in FIGS. 4a and 4b, the transistor device 401a represents a transistor device that is incorporated in a new custom IC design before folding. Transistor device

401b depicts transistor device 401a folded into 3 transistors. It can be seen that only two local wires (two tracks) are needed for connecting the same source (S) terminals and drain (D) terminals. For other folding numbers, such as 5,7,9 . . . folds, only two local wires are needed for connecting the same source/drain terminals. Therefore, a method of an embodiment sets the routing overhead $S_{ji}(n)$ as a constant. Setting $Q=K+S_{ji}(n)$, Q is then also set as a constant.

By adding up the transistor area and routing area. The objective function becomes:

$$\text{minimize}(\Sigma \text{rowheigt}_i + Q) * \text{maxrowlength}) \quad (11)$$

Thus, the present method determines how to fold each transistor to reduce the area of physical layout by taking the advantage of different rows' lengths.

From Equation 11, the total chip area of the IC may be reduced by reducing the heights of the rows and finding the optimal maxrowlength which can give freedom for each row to fold the transistors in the row to achieve the maximum area reduction.

According to Equation 11, the area is determined by two items, maxrowlength and $\Sigma \text{rowheight}_i$. Therefore, the system and method of the embodiment optimizes the overall chip area in two-phases. Phase I determines the maxrowlength. Phase II determines row height. By doing this, the method and systems solves the two-dimensional transistor folding problem.

Phase I: Finding Maxrowlength In this phase, the maxrowlength is calculated. From the layout after transistor sizing, the initial maxrowlength$_{init}$ is identified Each row can become the longest row after folding the transistors in that row. The length of row j can be represented as:

$$\text{rowlength}_j = a_1 l_1 + a_2 l_2 + \ldots + a_i l_i + \ldots a_n l_n \quad (12)$$

Where $l_i$ is the length of transistor i in the row and includes contacts etc. $a_1, a_2 \ldots, a_n$ are integers. $a_i$ indicates how many splits transistor i has. The range of $a_i$ can be represented by:

$$1 \le a_i < \frac{LENGTHLIMIT - \text{initial row's length}}{l_i} \quad (13)$$

where LENGTHLIMIT is the limit of the row length, which is user defined. The number of all possible lengths of row j is:

$$\prod_{i=1}^{m} \left( \frac{LENGTHLIMIT - \text{initial row's length}}{l_i} \right) \quad (14)$$

where m is the numbers of transistor in row j. Among all possible lengths, the bestrowlength$_j$ for row j can be found to achieve the best area reduction due to the folding. Bestrowlength$_j$ can be longer than maxrowlength$_{initial}$ as long as:

$$\text{bestrowlength}_j \times (H - \Delta H) \le \max \text{rowlength}_{init} \times H \quad (15)$$

where H is the height of row j. $\Delta H$ is the amount of the height of the row that will be decreased due to the folding.

After Phase I, the method builds a set (S) of bestrowlength$_j$ by choosing the bestrowlength$_j$ which is greater than maxrowlength$_{init}$. Each value in the set (S) is a potential maxrowlength. Because it may not known which one results in the maximum total area reduction of the layout, each will be used in Phase II to find the maximum area reduction.

Phase II: Folding Transistors

In this phase, the area reduction for folding transistors based on each maxrowlength is calculated and the maximum area reduction as the final result is selected. In order to reduce the computation, minh is first calculated for each row. minh is the possible minimum height of the row after folding. The transistor device heights that are greater than minh are possible solutions. The following equation calculates the minh.

$$\sum \left( \frac{h_i}{\min h} \right) \times l_i \le \max \text{ rowlength} \quad (16)$$

Because one goal is to minimize minh, the above equation becomes $\Sigma(h_i/\text{minh})*l_i=\text{maxrowlength}$ The idea of introducing minh can be used to reduce the computation.

Figure 5:
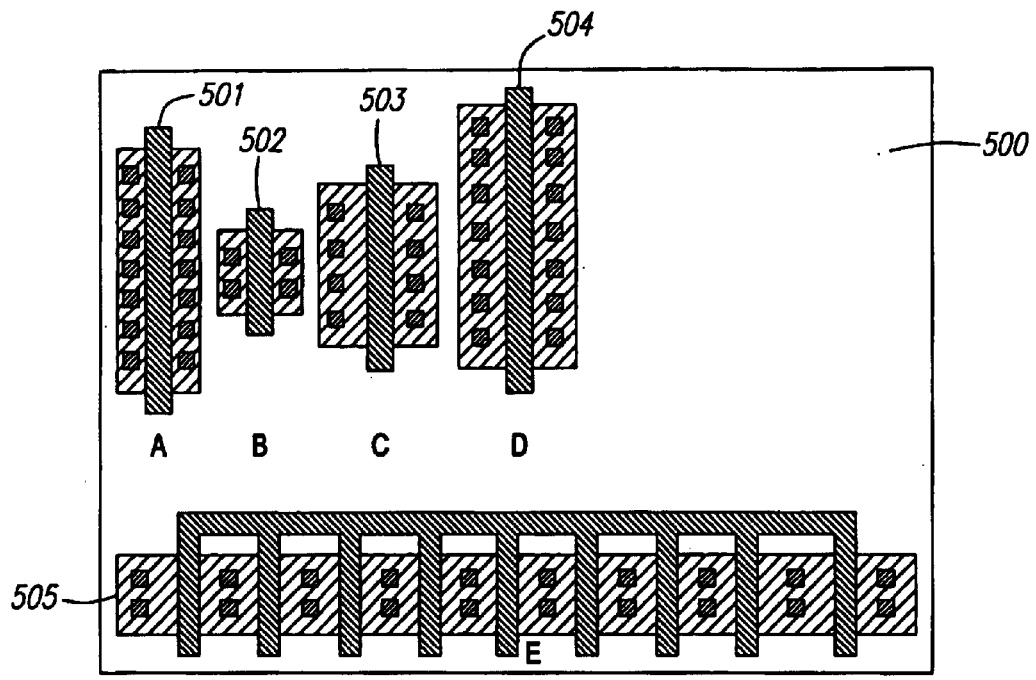
FIG. 5 illustrates an example of a physical layout after transistor sizing.
Figure 6:
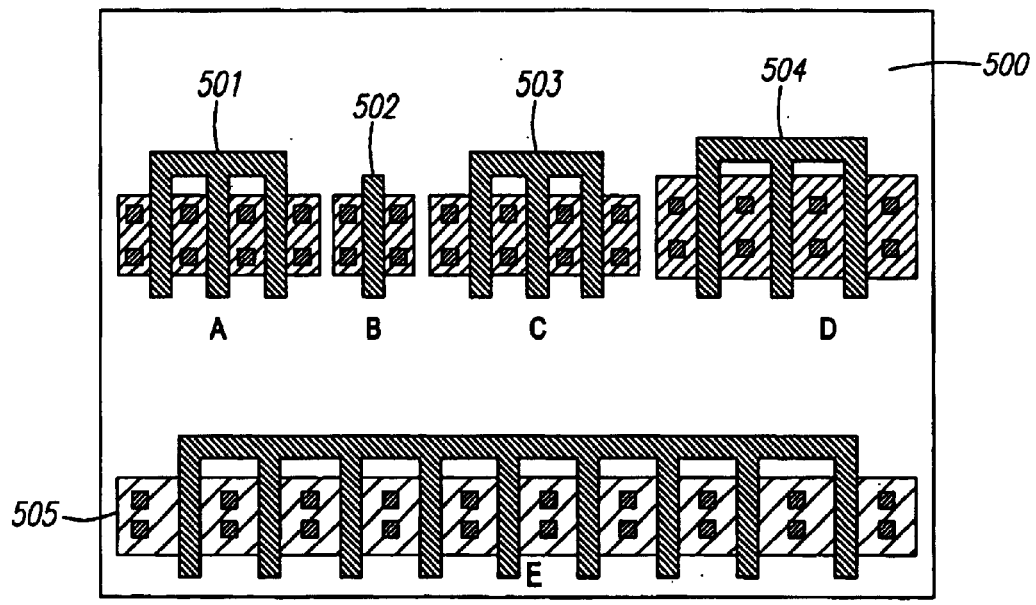
FIG. 6 illustrates an example of the optimized physical layout after transistor folding.

Referring to FIGS. 5 and 6, the method is described by way of an example. FIG. 5 illustrates a sample IC layout. Known transistor devices 501, 502, 503, and 504 are placed onto the IC substrate 500 in row 1. Transistor device 505 is placed onto the IC substrate in row 2. The lengths of transistor devices 501, 502, 503, 504, and 505 are 4, 4, 6, 4, and 40, respectively. The heights are 12, 4, 8, 15, and 4, respectively. Suppose transistor device 505 is a macro cell whose geometry cannot be modified. In Phase I, the method finds the initial maxrowlength is 40 (the length of transistor device 505 in row 2). For row 2, the method finds the possible maxrowlength, it is still 40. In Phase II, the method first calculates the minh of row 1:

$$((12/\text{minh})*4)+((4/\text{minh})*4)+((8/\text{minh})*6)+((15/\text{minh})*4)=40 \quad (17)$$

Solving for minh, the equation yields minh=4.3. Keeping in mind that the minimum height possible is 4.3, the method then calculates the possible heights of each transistor in the row as it is folded. Transistor device 501, for example, begins with an initial height of 12. Folding transistor 501 into 2 segments yields a new height of 6. Folding transistor 501 into 3 segments yields a height of 4. This is not a possible solution for the height of row 1 as it does not meet the minh of 4.3. Referring to transistor 502, the initial height of the transistor is already denoted to be 4, thus no further folding of transistor 502 is needed. Transistor 503 is initially designed with a height of 8. Folding transistor 503 into 2 segments yields a transistor height of 4. Transistor 504 is designed with an initial height of 15. Folding this transistor into 2 segments yields a transistor with a height of 7.5 (rounded to be 8). Folding transistor 504 into 3 segments yields a transistor with a height of 5. Any further folding of transistor 504 will not yield a possible height solution as it will be lower than the calculated minh. Thus, the possible height solutions for row 1 are 8, 6, or 5.

A transistor may be folded an integral number of times. Solving for the length of row 1 for a height of 8, the length is found to be approximately 26. Solving for a height of 6, the length is approximated to be 36. Setting the height of row 1 to 5 provides a row length of 40. If the height of row 1 is set any lower than 5, the length of row 1 exceeds the maxrowlength of 40. At this point each transistor is folded such that their heights do not exceed the row height of 5.

FIG. 6 illustrates the final optimized physical layout of the IC. By folding the transistor 501, 502, 503, and 504 additional space is allotted between rows. This space can be used either to incorporate additional transistor devices within the IC substrate or may provide additional spacing to counteract any potential parasitic effect.

The method described herein may be performed by the computer system described earlier in FIG. 1. The computer 110 contains a stored program code to implement the steps of the optimization method. The possible stored code for Phase I may be as follows:

```
for each row
    for(each transistor in the row) {
        find.possible.fold.size (w₁, w₂, . . . wₙ)
    }
    for(each set of possible height) {
        merge( ), merging all possible transistor heights.
    }
    for(each possible transistor height) {
        find the bestrowlength_j
    }
```

In line 3 of the above code, $w_n = h_i/n$; where $w_n \geq \text{MINSIZE}$, and $h_i$ is the height of transistor i. Since any transistor can be folded only by multiple-integrals, the possible heights of transistor i are represented by the equation $h_i/n$, where $(h_i/n \geq \text{MINSIZE})$. Lines 2–4, of the exemplary code, calculate all the possible heights of each transistor in the row. Next, lines 5–7 merge all calculated possible heights of the transistors into a set of monotonously decreasing possible row heights. Finally, lines 8–9 compute area reduction and find the maximum area reduction. The bestrowlength_j is also calculated from lines 8–9.

The possible stored code for Phase II may be as follows:

```
for each maxrowlength
    for each row
        find the minimum row's height (minh) based on the
        current maxrowlength (maxrowlength).
            for each height from the highest possible
            height to minimum row's height
            estimate the folding effect,
            if (new rowlength < maxrowlength) continue;
        if (new rowlength ≥ maxrowlength) find the new
        row's length and break;
            end
        end
    end
    find the maximum area reduction.
    folding transistors.
```

Note that in the loop of the above procedure, the transistors for each possible maxrowlength are not actually folded. Rather the original transistor geometry information is kept so that the estimation of the area reduction for the next possible maxrowlength may be calculated. Once the maximum are reduction is calculated the HDL editor 190 may re-configure the geometry of each transistor device through the use of a folding technique.

The complexity of lines 2–4 of the exemplary stored code for Phase I may be represented by the function $O(n)$, where n is the number of the transistors in the circuit. Thus, the amount of time to process and perform the function denoted by lines 2–4 of the stored code is directly a function of the number of transistor in the circuit. Furthermore, the complexity of lines 5 and 6 are also represented by the same function $O(n)$. In line 3 of the stored code, a set of sorted possible heights is generated for each transistor. The time needed to generate the set is a linear function of the transistors in the set. Likewise, the complexity of lines 8–9 is also represented by the function $O(n)$. Thus, the time needed to calculate the maxrowlength is linearly related to the number of transistors in the circuit.

In Phase II, the number of maxrowlength may be represented as Q, and the number of rows may be represented by m. Thus, the total number of possible heights of each row is $p*n/Q$, where p is the maximum number of possible heights of each transistor. Therefore, the total complexity will be $O(Q*m*p*n/Q)$. Simplifying the function, the resulting complexity function is represented as $O(m*p*n)$. In the usual case, m and p are bounded. Therefore, the complexity of Phase II of the method can be represented by the function $O(n)$. In the worst case, m=n, the complexity of the algorithm takes on the form of $O(n^2)$. As the situation where each row has only one transistor (i.e., m=n). On average, the computation complexity of the method is $O(n)$. Thus, the method described herein can be said to have a computational complexity of $O(n)$. Therefore, the time needed to complete the optimization method described herein is linearly related to the total number of transistors in the circuit.

A system and method of practical transistor folding has been described herein which can be used in the high performance IC physical design flow. The system and method takes the advantage of different rows' lengths and introduces the possible minimum row's height (minh) which reduces the computation. The experimental results show the efficacy of the algorithm.

While preferred embodiments of the invention have been described herein, many variations are possible which remain within the concept and scope of the invention. Such variations would become clear to one skilled in the art upon perusal of the description of the embodiments set forth herein.

What is claimed is:

1. A method of optimizing an integrated circuit layout comprising the steps of:
    a) calculating a first total chip area of a first proposed layout, the first proposed layout representing transistor devices placed on the integrated circuit layout;
    b) determining a possible rowlength value that produces a modified total chip area less than the first total chip area;
    c) calculating a minimum row height corresponding to the determined possible rowlength value;
    d) iteratively varying the height value of a row, wherein the height is greater than the minimum row height;
    e) calculating a value of the modified total chip area using the determined possible rowlength value and iteratively varied height value;
    f) iteratively repeating steps b) through e) to determine an optimal total chip area; and
    g) generating an optimal integrated circuit layout.

2. The method of claim 1, wherein the step of calculating a minimum row height comprises dividing the sum of areas of transistor devices placed in the first proposed layout by the determined possible rowlength.

3. The method of claim 1, wherein the step of calculating a first total chip area comprises multiplying a maximum rowlength of the first proposed layout by a first total height of the first proposed layout.

4. The method of claim 1, wherein the step of calculating a modified total chip area comprises calculating a total rowheight value by adding a constant Q to the iteratively varied height value, wherein the constant Q represents a sum of a reserved space for routing between rows and an additional space that is introduced locally to each transistor as a result of transistor folding;
    calculating a second total height by adding the total rowheight of each row; and multiplying the second total height by the determined possible rowlength value.

5. The method of claim 1, further comprising the step of folding each transistor device to achieve the varied height value used for each row of the optimal integrated circuit layout.

6. A system for optimizing an integrated circuit layout comprising:
   a) means for calculating a first total chip area of a first proposed layout, the first proposed layout representing transistor devices placed on the integrated circuit layout;
   b) means for determining a possible rowlength value that produces a modified total chip area less than the first total chip area;
   c) means for calculating a minimum row height corresponding to the determined possible rowlength value;
   d) means for iteratively varying the height value of a row, wherein the height is greater than the minimum row height;
   e) means for calculating a value of the modified total chip area using the determined possible rowlength value and iteratively varied height value;
   l) means for iteratively repeating steps b) through e) to determine an optimal total chip area; and
   g) means for generating an optimal integrated circuit layout.

7. The system of claim 6, wherein the means for calculating a minimum row height comprises a means for dividing the sum of areas of transistor devices placed in the first proposed layout by the determined possible rowlength.

8. The system of claim 6, wherein the means for calculating a first total chip area comprises a means for multiplying a maximum rowlength of the first proposed layout by a first total height of the first proposed layout.

9. The system of claim 6, wherein the means for calculating a modified total chip area comprises:
   means for calculating a total rowheight value by adding a constant Q to the iteratively varied height value, wherein the constant Q represents a sum of a reserved space for routing between rows and an additional space that is introduced locally to each transistor as a result of transistor folding;
   means for calculating a second total height by adding the total rowheight of each row; and
   means for multiplying the second total height by the determined possible rowlength value.

10. The system of claim 6, further comprising a means for folding each transistor device to achieve the varied height value used for each row of the optimal integrated circuit layout.

11. A system for optimizing an integrated circuit layout comprising:
   a layout database, wherein the layout database stores known layouts for integrated circuit functions;
   a computer processor for calculating a first total chip area, a modified total chip area, and a minimum height of a row corresponding to a determined possible rowlength, the computer processor is further capable of determining the possible rowlength such that the modified total chip area is less than the first total chip area;
   a row height generator capable of generating iteratively variable row heights greater than the calculated minimum row height; and
   a display capable of generating an image of the optimal integrated circuit layout.

12. A method for area layout reduction comprising the steps of:
   placing transistor devices in rows of a first layout design,
   calculating an area value for the first layout design;
   determining a maximum row length of the first layout design;
   determining a set of possible row lengths for each row of the first layout design;
   selecting a row length for each row resulting in a maximum area reduction for that row;
   determining a minimum height after folding for each row to achieve the selected rowlength;
   determining a set of possible new heights for each row;
   iteratively selecting a new height for each row from the set of possible new heights, the new height being above the row's minimum height but below the row's current height, such that the area of the first layout design is reduced; and
   folding the transistor devices in each row to conform with the selected new height.

13. The method of claim 12, wherein the step of determining the minimum row height comprises dividing the sum of areas of transistor devices placed in the first proposed layout by the determined possible rowlength.

14. The method of claim 12, wherein the step of calculating the area value comprises multiplying a maximum rowlength of the first layout design by a first total height of the first layout design.

15. A system for optimizing an integrated circuit layout comprising:
   a means for placing transistor devices in rows of a first layout design,
   a means for calculating an area value for the first layout design;
   a means for determining a maximum row length of the first layout design;
   a means for determining a set of possible row lengths for each row of the first layout design;
   a means for selecting a row length for each row resulting in a maximum area reduction for that row;
   a means for determining a minimum height after folding for each row to achieve the selected rowlength;
   a means for determining a set of possible new heights for each row;
   a means for iteratively selecting a new height for each row from the set of possible new heights, the new height being above the row's minimum height but below the row's current height, such that the area of the first layout design is reduced; and
   a means for folding the transistor devices in each row to conform with the selected new height.

16. The system of claim 15, wherein the means for determining the minimum row height comprises means for dividing the sum of areas of transistor devices placed in the first proposed layout by the determined possible rowlength.

17. A method of designing an integrated circuit layout comprising:
   placing a plurality of cells on a first design layout;
   folding two or more of the plurality of cells of the first design layout; and
   determining an optimal height and length parameter for rows of the first design layout, wherein determining the optimal length parameter comprises:

proposing a possible row length value for each row of the first design layout such that a total chip area is reduced; and storing said possible row length values as a first set in memory.

18. The method of claim 17, further comprising calculating a minimum height of each row corresponding to each possible row length value stored in the set, generating a second set of possible row height values wherein each possible row height is greater than the calculated minimum height, and storing the second set in memory.

19. The method of claim 18, further comprising iteratively calculating total chip area values using each possible row length value stored in the first set and each possible row height value stored in the second set.

20. The method of claim 19, further comprising the step of determining the optimal total chip area from the iteratively calculated total chip area values.

21. A system for designing an integrated circuit layout comprising:

means for placing transistor devices on a first design layout;

means for folding transistor devices in a plurality of cells of the first design layout; and means for determining an optimal height and length parameter for rows of the first design layout, wherein the means for determining the optimal length parameter comprises:

means for proposing a possible row length values for each row of the first design layout such that a total chip area is reduced; and means for storing said possible row length values as a first set in memory.

22. The system of claim 21, further comprising means for calculating a minimum height of each row corresponding to each possible row length value stored in the set, means for generating a second set of possible row height values wherein each possible row height is greater than the calculated minimum height, means for and storing the second set in memory.

23. The system of claim 22, further comprising means for iteratively calculating total chip area values using each possible row length value stored in the first set and each possible row height value stored in the second set.

24. The system of claim 23, further comprising means for determining the optimal total chip area from the iteratively calculated total chip area values.

25. A method of designing an integrated circuit layout comprising the steps of:

placing transistor devices on a first design layout;

folding transistor devices in each row of the first design layout to provide an optimal total chip area for the integrated circuit layout based on a global analysis of the total chip area reduction; and determining an optimal height and length parameter for rows of the first design layout, wherein determining the optimal length parameter comprises:

proposing a possible row length values for each row of the first design layout such that a total clip area is reduced; and storing said possible row length values as a first set in memory.

26. The method of claim 25, further comprising calculating a minimum height of each row corresponding to each possible row length value stored in the set, generating a second set of possible row height values wherein each possible row height is greater than the calculated minimum height, and storing the second set in memory.

27. The method of claim 26, further comprising iteratively calculating total chip area values using each possible row length value stored in the first set and each possible row height value stored in the second set.

28. The method of claim 27, further comprising the step of determining the optimal total chip area from the iteratively calculated total chip area values.

29. A method of designing an integrated circuit layout comprising the steps of:

placing a number of transistor devices on a first design layout;

determining optimal height and length parameters for each row of the first layout design wherein step of determining the optimal height and length parameters in each row occurs in a time that is linearly related to the number of transistor devices placed on the first design layout and the step of determining the optimal length parameter comprises proposing a possible row length values for each row of the first design layout such that a total chip area is reduced and storing said possible row length values as a first set in memory; and folding transistor devices in each row of the first design layout to conform with the optimal height and length parameters.

30. The method of claim 29, further comprising calculating a minimum height of each row corresponding to each possible row length value stored in the set, generating a second set of possible row height values wherein each possible row height is greater than the calculated minimum height, and storing the second set in memory.

31. The method of claim 30, further comprising iteratively calculating total chip area values using each possible row length value stored in the first set and each possible row height value stored in the second set.

32. The method of claim 31, further comprising the step of determining the optimal total chip area from the iteratively calculated total chip area values.

33. A system for designing an integrated circuit layout comprising:

means for placing and routing transistor devices on a first design layout;

means for folding transistor devices of the first design layout based on analysis of both transistor area and routing area; and means for determining an optimal height and length parameter for rows of the first design layout, wherein the means for determining the optimal length parameter comprises:

means for proposing a possible row length values for each row of the first design layout such that the total chip are is reduced; and means for storing said possible row length values as a first set in memory.

34. The system of claim 33, further comprising means for calculating a minimum height of each row corresponding to each possible row length value stored in the set, generating a second set of possible row height values wherein each possible row height is greater than the calculated minimum height, and storing the second set in memory.

35. The system of claim 34, further means for comprising iteratively calculating total chip area values using each possible row length value stored in the first set and each possible row height value stored in the second set.

36. The system of claim 35, further comprising determining the optimal total chip area from the iteratively calculated total chip area values.

37. A method for designing an integrated circuit layout comprising the steps of:
- placing and routing transistor devices on a first design layout;
- folding transistor devices of the first design layout based on analysis of both transistor area and routing area; and
- determining an optimal height and length parameter for rows of the first design layout, wherein determining the optimal length parameter comprises:
  - proposing a possible row length values for each row of the first design layout such that the total chip are is reduced; and
  - storing said possible row length values as a first set in memory.

38. The method of claim 37, further comprising calculating a minimum height of each row corresponding to each possible row length value stored in the set, generating a second set of possible row height values wherein each possible row height is greater than the calculated minimum height, and storing the second set in memory.

39. The method of claim 38, further comprising iteratively calculating total chip area values using each possible row length value stored in the first set and each possible row height value stored in the second set.

40. The method of claim 39, further comprising the step of determining the optimal total chip area from the iteratively calculated total chip area values.

41. A computer program product embodied on computer readable medium, the computer readable medium having stored thereon a sequence of instructions which, when executed by a processor, causes the processor to execute a method for optimizing an integrated circuit layout, the method comprising:
  a) calculating a first total chip area of a first proposed layout, the first proposed layout representing transistor devices placed on the integrated circuit layout;
  b) determining a possible rowlength value that produces a modified total chip area less than the first total chip area;
  c) calculating a minimum row height corresponding to the determined possible rowlength value;
  d) iteratively varying the height value of a row, wherein the height is greater than the minimum row height;
  e) calculating a value of the modified total chip area using the determined possible rowlength value and iteratively varied height value;
  f) iteratively repeating steps b) through e) to determine an optimal total chip area; and
  g) generating an optimal integrated circuit layout.

42. The computer program product of claim 41, wherein the step of calculating a minimum row height comprises dividing the sum of areas of transistor devices placed in the first proposed layout by the determined possible rowlength.

43. The computer program product of claim 41, wherein the step of calculating a first total chip area comprises multiplying a maximum rowlength of the first proposed layout by a first total height of the first proposed layout.

44. The computer program product of claim 41, wherein the step of calculating a modified total chip area comprises calculating a total rowheight value by adding a constant Q to the iteratively varied height value, wherein the constant Q represents a sum of a reserved space for routing between rows and an additional space that is introduced locally to each transistor as a result of transistor folding;
  calculating a second total height by adding the total rowheight of each row; and
  multiplying the second total height by the determined possible rowlength value.

45. The computer program product of claim 41, further comprising the step of folding each transistor device to achieve the varied height value used for each row of the optimal integrated circuit layout.

46. A computer program product embodied on computer readable medium, the computer readable medium having stored thereon a sequence of instructions which, when executed by a processor, causes the processor to execute a method for area layout reduction, the method comprising:
  placing transistor devices in rows of a first layout design,
  calculating an area value for the first layout design;
  determining a maximum row length of the first layout design;
  determining a set of possible row lengths for each row of the first layout design;
  selecting a row length for each row resulting in a maximum area reduction for that row;
  determining a minimum height after folding for each row to achieve the selected rowlength;
  determining a set of possible new heights for each row;
  iteratively selecting a new height for each row from the set of possible new heights, the new height being above the row's minimum height but below the row's current height, such that the area of the first layout design is reduced; and
  folding the transistor devices in each row to conform with the selected new height.

47. The computer program product of claim 46, wherein determining the minimum row height comprises dividing the sum of areas of transistor devices placed in the first proposed layout by the determined possible rowlength.

48. A system of designing an integrated circuit layout comprising:
  means for placing a number of transistor devices on a first design layout;
  means for determining optimal height and length parameters for each row of the first layout design wherein the means for determining the optimal height and length parameters in each row occurs in a time that is linearly related to the number of transistor devices placed on the first design layout and the means for determining the optimal length parameter comprises means for proposing a possible row length value for each row of the first design layout such that a total chip area is reduced and storing said possible row length values as a first set in memory; and
  means for folding transistor devices in each row of the first design layout to conform with the optimal height and length parameters.

49. The system of claim 48, further comprising:
  means for calculating a minimum height of each row corresponding to each possible row length value stored in the set; and
  means for generating a second set of possible row height values wherein each possible row height is greater than the calculated minimum height, and storing the second set in memory.

50. A system for designing an integrated circuit layout comprising:
  means for placing a plurality of cells on a first design layout;
  means for folding two or more of the plurality of cells of the first design layout; and means for determining an optimal height and length parameter for rows of the first design layout, wherein determining the optimal length parameter comprises:

means for proposing a possible row length value for each row of the first design layout such that a total chip area is reduced; and means for storing said possible row length values as a first set in memory.

51. The system of claim 50, further comprising:

means for calculating a minimum height of each row corresponding to each possible row length value stored in the set, generating a second set of possible row height values wherein each possible row height is greater than the calculated minimum height, and storing the second set in memory;

means for iteratively calculating total chip area values using each possible row length value stored in the first set and each possible row height value stored in the second set; and means for determining the optimal total chip area from the iteratively calculated total chip area values.

52. A computer program product embodied on computer readable medium, the computer readable medium having stored thereon a sequence of instructions which, when executed by a processor, causes the processor to execute a method for designing an integrated circuit layout, the method comprising:

placing a plurality of cells on a first design layout;

folding two or more of the plurality of cells of the first design layout; and determining an optimal height and length parameter for rows of the first design layout, wherein determining the optimal length parameter comprises:

proposing a possible row length value for each row of the first design layout such that a total chip area is reduced; and storing said possible row length values as a first set in memory.

53. The computer program product of claim 52, further comprising:

calculating a minimum height of each row corresponding to each possible row length value stored in the set, generating a second set of possible row height values wherein each possible row height is greater than the calculated minimum height, and storing the second set in memory;

iteratively calculating total chip area values using each possible row length value stored in the first set and each possible row height value stored in the second set; and determining the optimal total chip area from the iteratively calculated total chip area values.

54. A computer program product embodied on computer readable medium, the computer readable medium having stored thereon a sequence of instructions which, when executed by a processor, causes the processor to execute a method for designing an integrated circuit layout, the method comprising:

placing transistor devices on a first design layout;

folding transistor devices in a plurality of cells of the first design layout; and determining an optimal height and length parameter for rows of the first design layout, wherein the means for determining the optimal length parameter comprises:

proposing a possible row length values for each row of the first design layout such that a total chip area is reduced; and storing said possible row length values as a first set in memory.

55. The computer program product of claim 54, further comprising:

calculating a minimum height of each row corresponding to each possible row length value stored in the set, generating a second set of possible row height values wherein each possible row height is greater than the calculated minimum height, and storing the second set in memory;

iteratively calculating total chip area values using each possible row length value stored in the first set and each possible row height value stored in the second set; and determining the optimal total chip area from the iteratively calculated total chip area values.

56. A method for designing an integrated circuit layout comprising:

placing transistor devices on a first design layout;

folding transistor devices in a plurality of cells of the first design layout; and determining an optimal height and length parameter for rows of the first design layout, wherein the means for determining the optimal length parameter comprises:

proposing a possible row length values for each row of the first design layout such that a total chip area is reduced; and storing said possible row length values as a first set in memory.

57. The method of claim 56, further comprising:

calculating a minimum height of each row corresponding to each possible row length value stored in the set, generating a second set of possible row height values wherein each possible row height is greater than the calculated minimum height, and storing the second set in memory;

iteratively calculating total chip area values using each possible row length value stored in the first set and each possible row height value stored in the second set; and determining the optimal total chip area from the iteratively calculated total chip area values.

58. A system of designing an integrated circuit layout comprising:

means for placing transistor devices on a first design layout;

means for folding transistor devices in each row of the first design layout to provide an optimal total chip area for the integrated circuit layout based on a global analysis of the total chip area reduction; and means for determining an optimal height and length parameter for rows of the first design layout, wherein the means for determining the optimal length parameter comprises:

means for proposing a possible row length values for each row of the first design layout such that a total clip area is reduced; and means for storing said possible row length values as a first set in memory.

59. The system of claim 58, further comprising:

means for calculating a minimum height of each row corresponding to each possible row length value stored in the set;

means for generating a second set of possible row height values wherein each possible row height is greater than the calculated minimum height;

means for storing the second set in memory;

means for iteratively calculating total chip area values using each possible row length value stored in the first set and each possible row height value stored in the second set; and means for determining the optimal total chip area from the iteratively calculated total chip area values.

60. A computer program product embodied on computer readable medium, the computer readable medium having stored thereon a sequence of instructions which, when executed by a processor, causes the processor to execute a method for designing an integrated circuit layout, the method comprising:

placing transistor devices on a first design layout;

folding transistor devices in each row of the first design layout to provide an optimal total chip area for the integrated circuit layout based on a global analysis of the total chip area reduction; and determining an optimal height and length parameter for rows of the first design layout, wherein the means for determining the optimal length parameter comprises:

proposing a possible row length values for each row of the first design layout such that a total clip area is reduced; and storing said possible row length values as a first set in memory.

61. The computer program product of claim 60, further comprising:

calculating a minimum height of each row corresponding to each possible row length value stored in the set;

generating a second set of possible row height values wherein each possible row height is greater than the calculated minimum height;

storing the second set in memory;

iteratively calculating total chip area values using each possible row length value stored in the first set and each possible row height value stored in the second set; and determining the optimal total chip area from the iteratively calculated total chip area values.

\* \* \* \* \*